(12) United States Patent
Liu et al.

(10) Patent No.: US 12,300,487 B2
(45) Date of Patent: May 13, 2025

(54) PHOTORESIST COMPOSITION AND METHOD OF FORMING PHOTORESIST PATTERN

(71) Applicant: TAIWAN SEMICONDUCTOR MANUFACTURING CO., LTD., Hsinchu (TW)

(72) Inventors: Chen-Yu Liu, Kaohsiung (TW); Ching-Yu Chang, Yilang County (TW); Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 726 days.

(21) Appl. No.: 16/559,062

(22) Filed: Sep. 3, 2019

(65) Prior Publication Data
US 2020/0105522 A1  Apr. 2, 2020

Related U.S. Application Data

(60) Provisional application No. 62/737,290, filed on Sep. 27, 2018.

(51) Int. Cl.
*H01L 21/02* (2006.01)
*G03F 7/004* (2006.01)
*G03F 7/16* (2006.01)

(52) U.S. Cl.
CPC ........ *H01L 21/02216* (2013.01); *G03F 7/004* (2013.01); *G03F 7/168* (2013.01)

(58) Field of Classification Search
CPC ............ H01L 21/02216; H01L 21/306; H01L 21/302; H01L 21/266; H01L 21/02282; H01L 21/02126; H01L 21/31116; H01L 21/31111; H01L 21/0332; H01L 21/31144; H01L 21/31138; H01L 21/31133; H01L 21/32139; H01L 21/02211; H01L 21/3081; H01L 21/3122; G03F 7/004; G03F 7/168; G03F 7/0751; G03F 7/11; G03F 7/40; G03F 7/36; G03F 7/0752; G03F 7/0757; G03F 7/2041; G03F 7/094; G03F 7/38; G03F 7/162; G03F 7/2022; G03F 7/0397;
(Continued)

(56) References Cited

U.S. PATENT DOCUMENTS

| | | |
|---|---|---|
| 8,178,287 B2 | 5/2012 | Chang |
| 8,796,666 B1 | 8/2014 | Huang et al. |
| 9,093,530 B2 | 7/2015 | Huang et al. |

(Continued)

FOREIGN PATENT DOCUMENTS

| | | |
|---|---|---|
| CN | 1573541 A | 2/2005 |
| CN | 101140420 A | 3/2008 |

(Continued)

*Primary Examiner* — Sean M DeGuire
*Assistant Examiner* — Richard David Champion
(74) *Attorney, Agent, or Firm* — STUDEBAKER BRACKETT PLLC

(57) ABSTRACT

A method of forming a photoresist pattern includes forming an upper layer including a floating additive polymer over a photoresist layer formed on a substrate. The photoresist layer is selectively exposed to actinic radiation. The photoresist layer is developed to form a pattern in the photoresist layer, and the upper layer is removed. The floating additive polymer is a siloxane polymer.

20 Claims, 16 Drawing Sheets

(58) Field of Classification Search
CPC ........ G03F 7/2032; G03F 7/203; G03F 7/091;
G03F 7/322; G03F 7/30; G03F 7/0002
See application file for complete search history.

(56) References Cited

U.S. PATENT DOCUMENTS

| | | |
|---|---|---|
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 9,857,684 B2 | 1/2018 | Lin et al. |
| 9,859,206 B2 | 1/2018 | Yu et al. |
| 9,875,892 B2 | 1/2018 | Chang et al. |
| 2007/0117411 A1* | 5/2007 | Ogihara .................. G03F 7/091 |
| | | 438/305 |
| 2007/0238300 A1* | 10/2007 | Ogihara ............ H01L 21/02282 |
| | | 438/702 |
| 2009/0130590 A1 | 5/2009 | Chen et al. |
| 2009/0136869 A1* | 5/2009 | Ogihara ................ G03F 7/0752 |
| | | 430/270.1 |
| 2010/0009132 A1 | 1/2010 | Cheng et al. |
| 2010/0112236 A1* | 5/2010 | Fletcher ................ G03F 7/0002 |
| | | 427/207.1 |
| 2012/0238095 A1* | 9/2012 | Ogihara ................ G03F 7/0757 |
| | | 430/296 |
| 2013/0108956 A1* | 5/2013 | Lu ........................... G03F 7/039 |
| | | 430/323 |
| 2013/0210229 A1* | 8/2013 | Ogihara .................... G03F 7/40 |
| | | 438/694 |
| 2013/0210236 A1* | 8/2013 | Ogihara .................... G03F 7/40 |
| | | 430/286.1 |
| 2015/0177432 A1 | 6/2015 | Hebrink et al. |
| 2016/0011516 A1* | 1/2016 | deVilliers ............... G03F 7/039 |
| | | 430/323 |
| 2016/0064220 A1* | 3/2016 | Ogihara .............. H01L 21/0332 |
| | | 438/514 |
| 2016/0096977 A1* | 4/2016 | Tachibana ............ G03F 7/0752 |
| | | 438/703 |
| 2016/0179004 A1* | 6/2016 | Chen .................... G03F 7/0757 |
| | | 430/281.1 |
| 2017/0052450 A1* | 2/2017 | Nakagawa ........... G03F 7/2022 |
| 2018/0122648 A1 | 5/2018 | Kim et al. |

FOREIGN PATENT DOCUMENTS

| | | | | |
|---|---|---|---|---|
| CN | 107203097 A | | 9/2017 | |
| JP | 2009126940 A | * | 6/2009 | ........... G03F 7/0752 |
| TW | 201234107 A | | 8/2012 | |
| TW | 201800861 A | | 1/2018 | |
| WO | 2007/148223 A2 | | 12/2007 | |

* cited by examiner

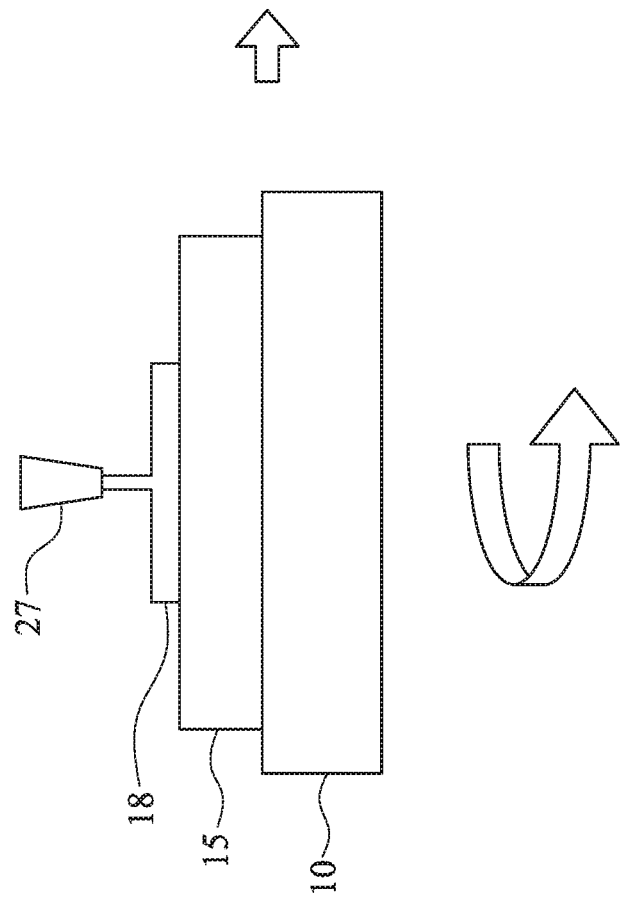
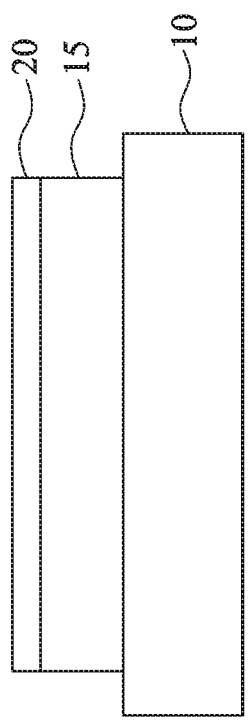
FIG. 3C
FIG. 3D

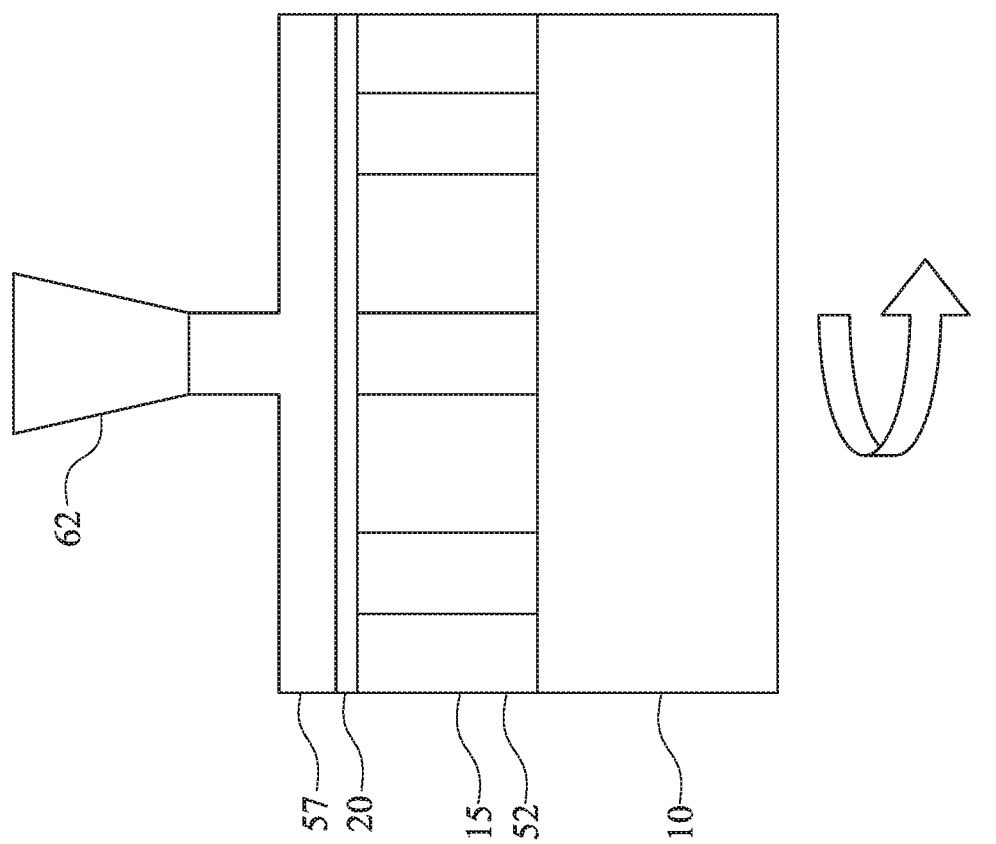

PHOTORESIST COMPOSITION AND METHOD OF FORMING PHOTORESIST PATTERN

CROSS-REFERENCE TO RELATED APPLICATIONS

This application claims priority to U.S. Provisional Patent Application No. 62/737,290, filed Sep. 27, 2018, the entire disclosure of which is incorporated herein by reference.

BACKGROUND

As consumer devices have gotten smaller and smaller in response to consumer demand, the individual components of these devices have necessarily decreased in size as well.

Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photosensitive materials. Such materials are applied to a surface and then exposed to an energy that has itself been patterned. Such an exposure modifies the chemical and physical properties of the exposed regions of the photosensitive material. This modification, along with the lack of modification in regions of the photosensitive that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

Extreme ultraviolet lithography (EUVL) has been developed to form smaller semiconductor device feature size and increase device density on a semiconductor wafer. As device features shrink it become difficult to maintain an aspect ratio of the photoresist patterns below 2.5. To prevent resist line collapse by capillary force during the spin dry process the resist thickness should be less than 50 nm. However, at photoresist thicknesses less than 50 nm there is little etch budget for etching a hard mask layer. In addition, at such low photoresist layer thickness and low aspect ratio, bottom scum is a greater issue compared to the immersion approach due to weak contrast and increased viscosity of the developer. Furthermore, dry etch de-scum may further reduce the etch budget.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, and 3D show process stages of sequential operations according to an embodiment of the disclosure.

FIG. 5 shows a process stage of a sequential operation according to an embodiment of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
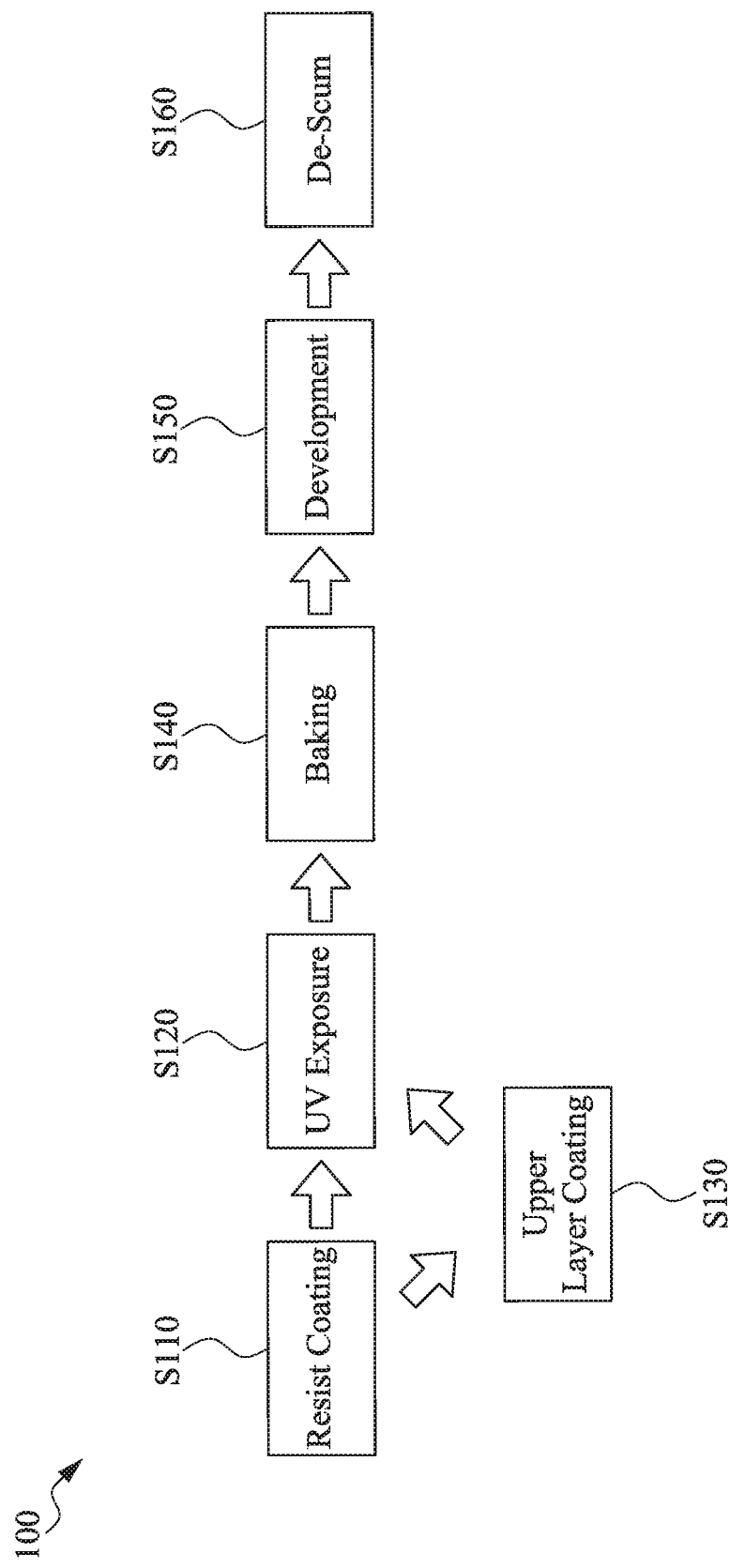
FIG. 1 illustrates a process flow according to embodiments of the disclosure.
Figure 2A:
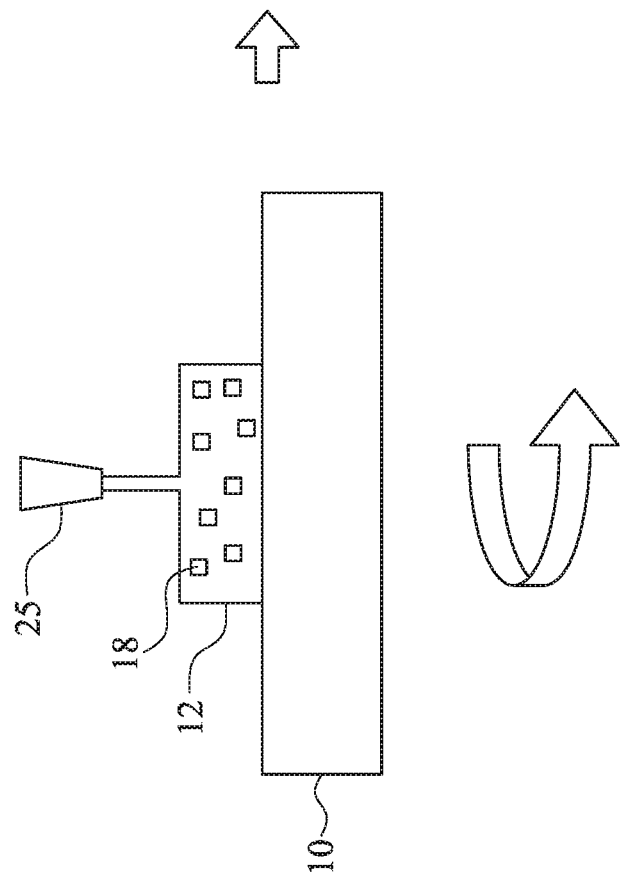
FIGS. 2A and 2B show process stages of sequential operations according to an embodiment of the disclosure.
Figure 2B:
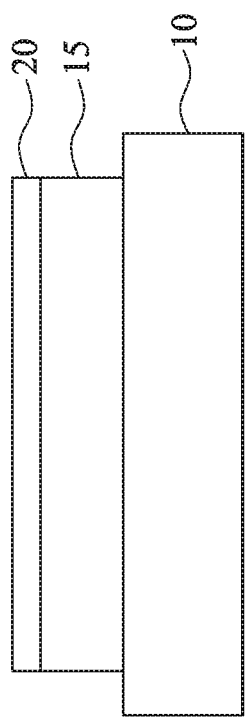

FIG. 1 illustrates a process flow 100 of manufacturing a semiconductor device according to embodiments of the disclosure. A photoresist 12 is coated on a surface of a layer to be patterned or a substrate 10 in operation S110, in some embodiments, to form a photoresist layer 15, as shown in FIGS. 2A and 2B. The photoresist 12 includes a floating additive polymer 18 that forms an upper layer 20 over the photoresist layer 15, as shown in FIG. 2B. The photoresist/floating additive polymer 12, 18 mixture is dispensed from a dispenser 25. While the photoresist/floating additive polymer mixture is applied or immediately thereafter, the substrate 10 is rotated.

Then the photoresist layer 15 subsequently undergoes a first baking operation to evaporate solvents in the photoresist composition in some embodiments. The photoresist layer 15 is baked at a temperature and time sufficient to dry the photoresist layer 15. In some embodiments after spin-coating, the floating additive polymer 18 phase separates from the mixture and forms an upper layer 20 over the photoresist layer during the baking operation, as shown in FIG. 2B. In some embodiments, the layers are heated to a temperature of about 40° C. and 120° C. for about 10 seconds to about 10 minutes.

Figure 3A:
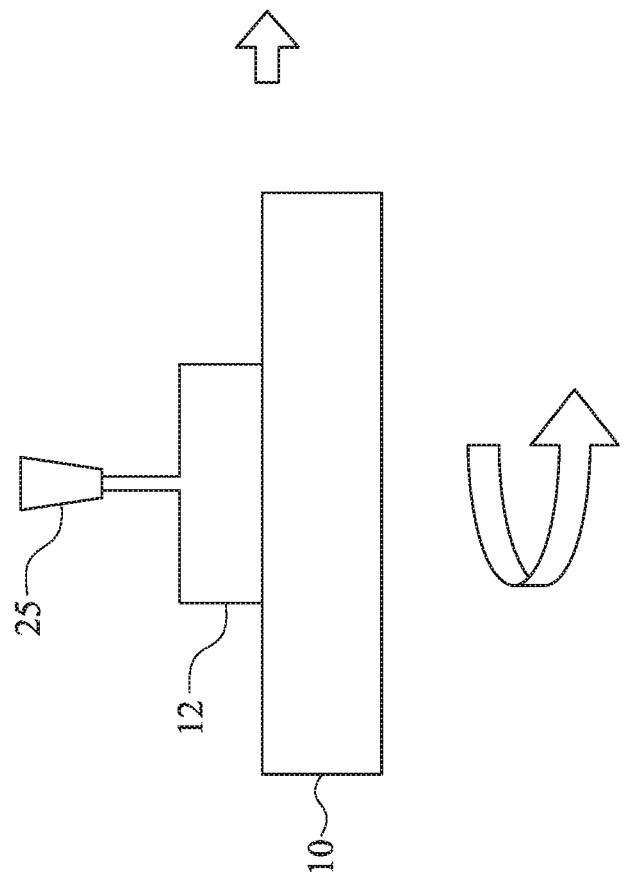
Figure 3B:
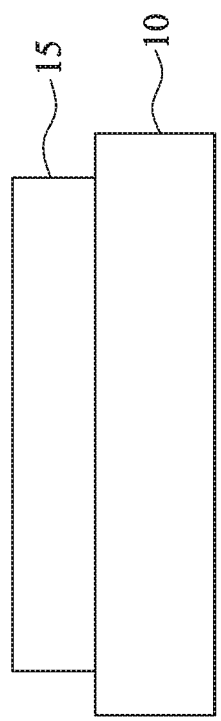

In other embodiments, the photoresist 12 is coated on a surface of a layer to be patterned or a substrate 10 in operation S110 to form a photoresist layer 15, as shown in FIGS. 3A and 3B. As explained in reference to FIG. 2A, the photoresist 12 is dispensed from a dispenser 25. While the photoresist 12 is applied or immediately thereafter, the substrate 10 is rotated. Then the photoresist layer 15 undergoes a first baking operation to evaporate solvents in the photoresist composition in some embodiments. In some embodiments, the photoresist layer 15 is heated to a temperature of about 40° C. and 120° C. for about 10 seconds to about 10 minutes.

After the first baking operation, an upper layer 20 including the floating additive polymer 18 is coated on the photoresist layer 15, as shown in FIGS. 3C and 3D. The upper layer composition is dispensed from a dispenser 27, as shown in FIG. 3C. While the upper layer composition is applied or immediately thereafter, the substrate 10 is rotated.

Then the upper layer 20 undergoes a baking operation to evaporate solvents in the floating additive polymer composition in some embodiments. The upper layer 20 is baked at a temperature and time sufficient to dry the upper layer 20. In some embodiments, the upper layer 20 is heated to a temperature of about 40° C. and 120° C. for about 10 seconds to about 10 minutes.

After the photoresist and upper layers 15, 20 undergo the baking operation, the photoresist layer 15 and upper layer 20 are selectively exposed to actinic radiation 45/97 (see FIGS. 4A and 4B) in operation S130. In some embodiments, the ultraviolet radiation is deep ultraviolet radiation. In some embodiments, the ultraviolet radiation is deep ultraviolet (DUV) or extreme ultraviolet (EUV) radiation. In some embodiments, the radiation is an electron beam. In some embodiments, the thickness of the upper layer 20 is sufficiently thin so that the upper layer 20 does not adversely affect the exposure of the photoresist layer 15 to the radiation 45/97. In some embodiments, the upper layer 20 has a thickness ranging from about 0.1 nm to about 20 nm. In some embodiments, the thickness of the upper layer 20 ranges from about 1 nm to about 15 nm. In an embodiment, a combined thickness of the photoresist layer and the upper layer ranges from about 10 nm to about 320 nm.

Figure 4A:
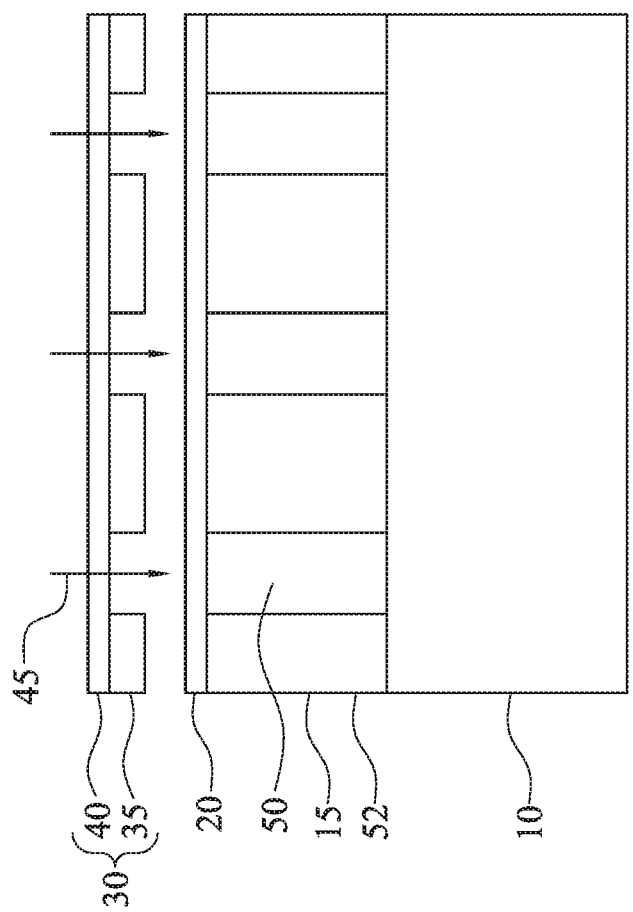
FIGS. 4A and 4B show process stages of sequential operations according to an embodiment of the disclosure.

As shown in FIG. 4A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 4B:
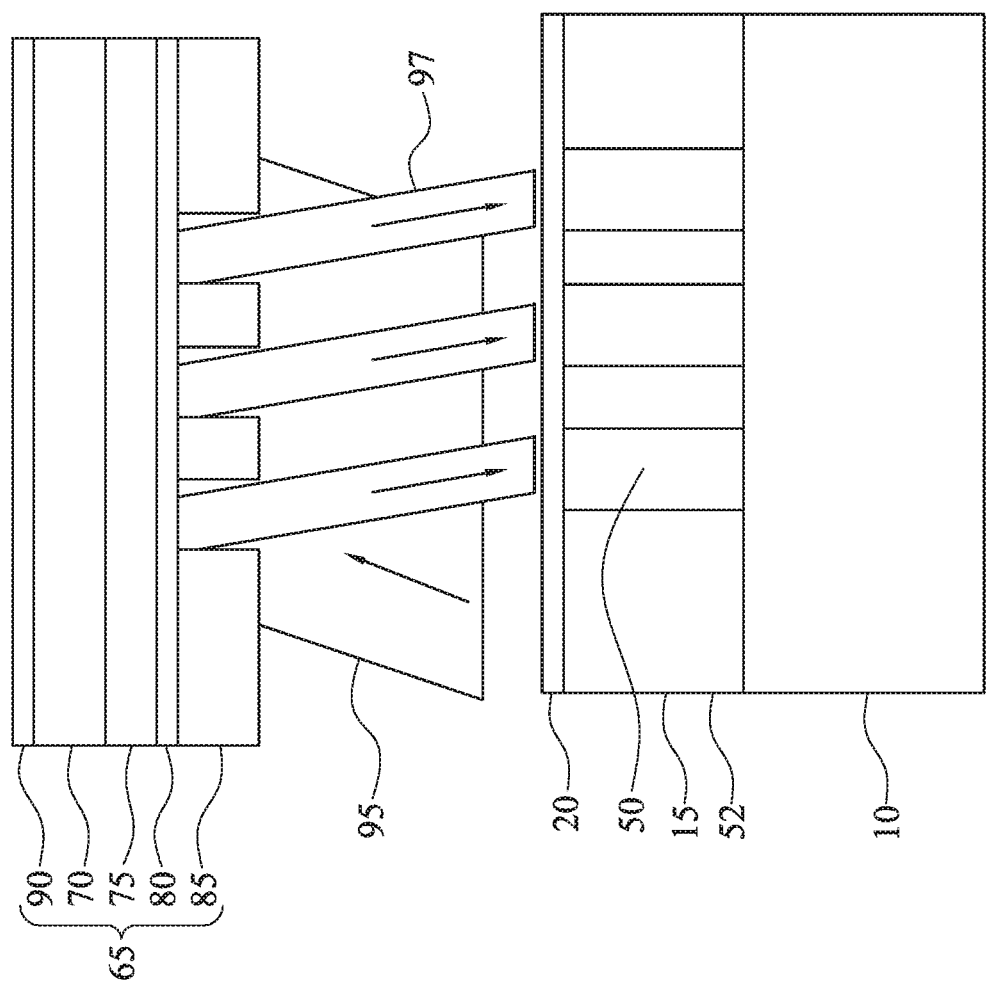

In some embodiments, the selective exposure of the photoresist layer 15 to form exposed regions 50 and unexposed regions 52 is performed using extreme ultraviolet lithography. In an extreme ultraviolet lithography operation a reflective photomask 65 is used to form the patterned exposure light, as shown in FIG. 4B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are between the reflective photomask 65 and the photoresist-coated substrate.

The region of the photoresist layer exposed to radiation 50 undergoes a chemical reaction thereby changing its solubility in a subsequently applied developer relative to the region of the photoresist layer not exposed to radiation 52. In some embodiments, the portion of the photoresist layer exposed to radiation 50 undergoes a crosslinking reaction.

Next, the photoresist layer 15 and upper layer 20 undergo a post-exposure bake in operation S140. In some embodiments, the photoresist layer 15 and upper layer 20 are heated to a temperature of about 50° C. and 160° C. for about 20 seconds to about 120 seconds. The post-exposure baking may be used in order to assist in the generating, dispersing, and reacting of an acid/base/free radical generated from the impingement of the radiation 45 upon the photoresist layer 15 during the exposure. Such thermal assistance helps to create or enhance chemical reactions which generate chemical differences between the exposed region 50 and the unexposed region 52 within the photoresist layer. These chemical differences also cause differences in the solubility between the exposed region 50 and the unexposed region 52.

Figure 6:
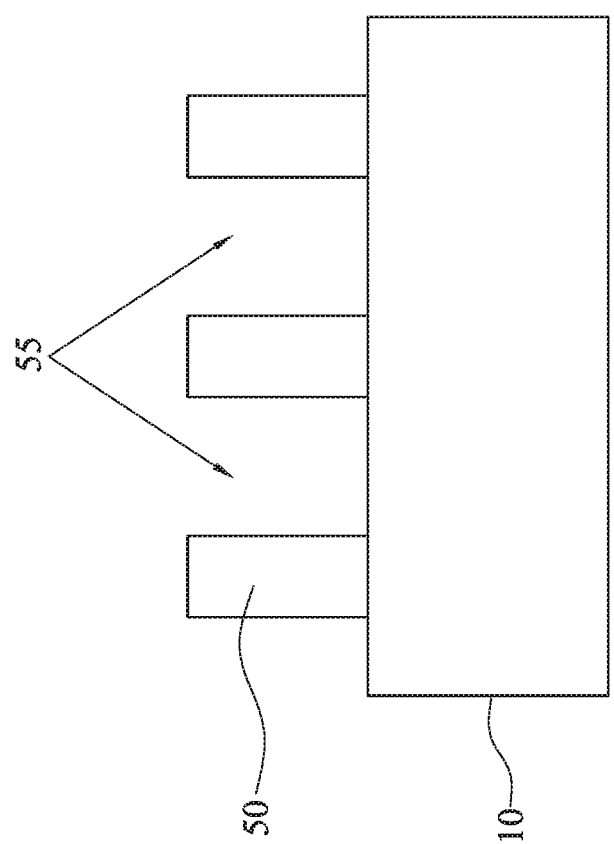
FIG. 6 shows a process stage of a sequential operation according to an embodiment of the disclosure.

The selectively exposed photoresist layer is subsequently developed by applying a developer to the selectively exposed photoresist layer in operation S150. As shown in FIG. 5, a developer 57 is supplied from a dispenser 62 to the photoresist layer 15 and upper layer 20. In some embodiments, the upper layer 20 and the unexposed region of the photoresist layer 52 are removed by the developer 57 forming a pattern of openings 55 in the photoresist layer 15 to expose the layer to be patterned or substrate 10, as shown in FIG. 6.

In some embodiments, a de-scum operation S160 is performed after the development operation S150. In some embodiments, the de-scum operation is performed using oxygen plasma. Using a plasma source, a monoatomic oxygen species is generated. The monoatomic oxygen combines with photoresist scum (or residue) to form ash, CO, or $CO_2$ which are removed using a vacuum pump in some embodiments. In some embodiments, monoatomic fluorine is instead of monoatomic oxygen. In some embodiments, the monoatomic oxygen plasma is generated using a high frequency RF source, such as a 13.56 MHz Rf source.

In some embodiments, the pattern of openings 55 in the photoresist layer 15 are extended into the layer to be patterned or substrate 10 to create a pattern of openings 55' in the substrate 10, thereby transferring the pattern in the photoresist layer 15 into the substrate 10, as shown in FIG.

7. The pattern is extended into the substrate by etching, using one or more suitable etchants. The exposed photoresist layer 50 is at least partially removed during the etching operation in some embodiments. In other embodiments, the exposed photoresist layer 50 is removed after etching the layer to be patterned or substrate 10 by using a suitable photoresist stripper solvent or by a photoresist ashing operation.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes at least one metal, metal alloy, and metal/nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least silicon, metal oxide, and metal nitride of the formula $MX_b$, where M is a metal or Si, X is N or O, and b ranges from about 0.4 to about 2.5. Ti, Al, Hf, Zr, and La are suitable metals, M, in some embodiments. In some embodiments, the substrate 10 includes silicon dioxide, silicon nitride, aluminum oxide, hafnium oxide, lanthanum oxide, and combinations thereof.

In some embodiments, the substrate includes a bottom anti-reflective coating (BARC) layer; a silicon hard mask, including CVD silicon hard mask and spin on hardmask; and a SOC layer.

The photoresist layer 15 is a photosensitive layer that is patterned by exposure to actinic radiation. Typically, the chemical properties of the photoresist regions struck by incident radiation change in a manner that depends on the type of photoresist used. The photoresist layers 15 are either positive tone resists or negative tone resists. A positive tone resist refers to a photoresist material that when exposed to radiation (typically UV light) becomes soluble in a developer, while the region of the photoresist that is non-exposed (or exposed less) is insoluble in the developer. A negative tone resist, on the other hand, conventionally refers to a photoresist material that when exposed to radiation becomes insoluble in the developer, while the region of the photoresist that is non-exposed (or exposed less) is soluble in the developer. The region of a negative tone resist that becomes insoluble upon exposure to radiation may become insoluble due to a cross-linking reaction caused by the exposure to radiation.

Whether a resist is a positive tone or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

Photoresists 12 according to the present disclosure include a polymer resin along with one or more photoactive compounds (PACs) in a solvent, in some embodiments. In some embodiments, the polymer resin includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like.

Examples of styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decompose, otherwise known as a leaving group or, in some embodiments in which the PAC is a photoacid generator, an acid labile group, is attached to the hydrocarbon structure so that, it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl) methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the polymer resin also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer resin includes groups that can assist in increasing the adhesiveness of the photoresist layer 15 to underlying structures (e.g., substrate 10). Polar groups may be used to help increase the adhesiveness. Suitable polar groups include hydroxyl groups, cyano groups, or the like, although any suitable polar group may, alternatively, be used.

Optionally, the polymer resin includes one or more alicyclic hydrocarbon structures that do not also contain a group which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (methacrylate), combinations of these, or the like.

Additionally, some embodiments of the photoresist 12 include one or more photoactive compounds (PACs). The PACs are photoactive components, such as photoacid generators, photobase generators, free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments in which the PACs are photobase generators, the PACs includes quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a cross-linking agent is added to the photoresist 12. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments the cross-linking agent has the following structure:

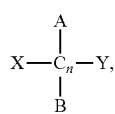

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the cross-linking agent include the following:

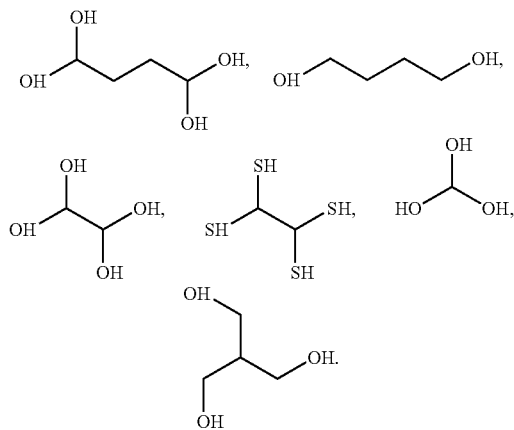

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer resin.

Alternatively, in some embodiments in which the coupling reagent is added to the photoresist 12 without the cross-linking agent, the coupling reagent is used to couple one group from one of the hydrocarbon structures in the polymer resin to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

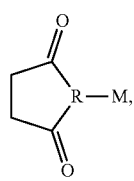

where R is a carbon atom, a nitrogen atom, a sulfur atom, or an oxygen atom; M includes a chlorine atom, a bromine atom, an iodine atom, $-NO_2$; $-SO_3-$; $-H-$; $-CN$; $-NCO$, $-OCN$; $-CO_2-$; $-OH$; $-OR^*$, $-OC(O)CR^*$; $-SR$, $-SO2N(R^*)_2$; $-SO_2R^*$; $SOR$; $-OC(O)R^*$; $-C(O)OR^*$; $-C(O)R^*$; $-Si(OR^*)_3$; $-Si(R^*)_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

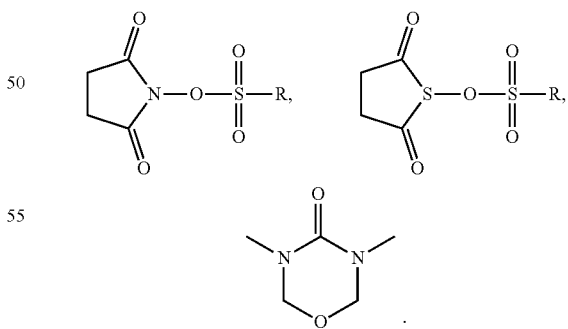

In some embodiments, the photoresist 12 includes a floating additive polymer 18 that forms an upper layer 20 when applied to a layer to be patterned or substrate 10. In some embodiments, the floating additive polymer is a siloxane polymer formed from one or more of the following monomers

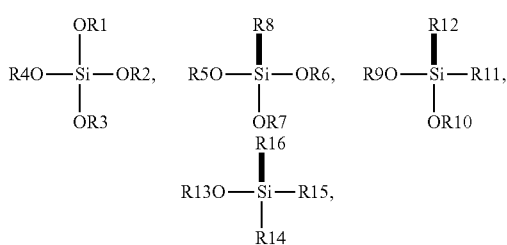

where the R groups could be modified to reduce the surface energy. R8, R11, R12, R15, and R16 are any C2 to C20 organic group optionally including fluorine in some embodiments. In some embodiments, each of R8, R11, R12, R15, and R16 is the same or different. R1, R2, R3, R4, R5, R6, R7, R9, R10, R13, and R14 are H or a C1 to C6 alkyl group optionally containing fluorine in some embodiments. In some embodiments, each of R1, R2, R3, R4, R5, R6, R7, R9, R10, R13, and R14 is the same or different.

In some embodiments, the floating additive polymer formed from the one or more monomers is a copolymer having a weight average molecular weight of about 5,000, as shown below:

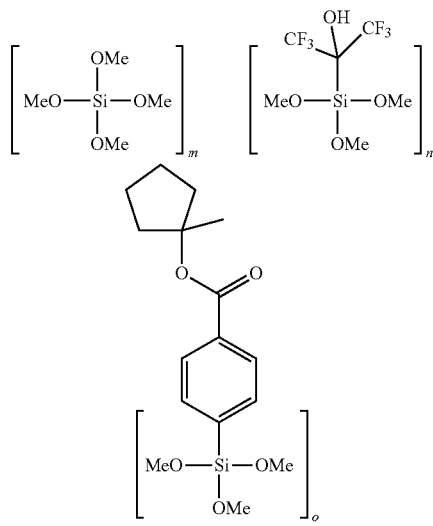

where m:n:o=0.2:0.3:0.5.

In some embodiments, the floating additive polymer containing upper layer 20 has a lower surface energy and lower etch rate than the photoresist layer 15. In some embodiments, the floating additive polymer 18 phase separates and rises to the upper layer because of its lower surface energy. In some embodiments, a weight average molecular weight of the floating additive polymer 18 ranges from 1000 to 20,000. In some embodiments, the concentration of Si in the floating additive polymer 18 ranges from 15 wt. % to 42 wt. % based on the weight of the floating additive polymer.

In some embodiments, the upper layer 20 contains a higher concentration of the floating additive polymer 18 than the photoresist layer 15.

In some embodiments the upper layer contains at least 5 wt. % of the floating additive polymer based on the total weight of the upper layer.

The individual components of the photoresist 12 and the floating additive polymer 18 are placed into a solvent in order to aid in the mixing and dispensing of the photoresist 12. To aid in the mixing and dispensing of the photoresist, the solvent is chosen at least in part based upon the materials chosen for the polymer resins as well as the PACs. In some embodiments, the solvent is chosen such that the polymer resins (photoresist polymer and floating additive polymer) and the PACs can be evenly dissolved into the solvent and dispensed upon the layer to be patterned.

In some embodiments, the solvent is an organic solvent, and includes one or more of any suitable solvents such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the photoresist 12 include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, methyl acetate, ethyl acetate, propyl acetate, butyl acetate, methyl lactate, ethyl lactate, propyl lactate, butyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, propylene carbonate, vinylene carbonate, ethylene carbonate, butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylether, monophenylether, dipropylene glycol monoacetate, dioxane, methyl pyruvate, ethyl pyruvate, propyl pyruvate, methyl methoxypropionate, ethyl ethoxypropionate, n-methylpyrrolidone (NMP), 2-methoxyethyl ether (diglyme), ethylene glycol monomethyl ether, propylene glycol monomethyl ether, methyl propionate, ethyl propionate, ethyl ethoxy propionate, methylethyl ketone, cyclohexanone, 2-heptanone, cyclopentanone, cyclohexanone, ethyl 3-ethoxypropionate, propylene glycol methyl ether acetate (PGMEA), methylene cellosolve, 2-ethoxyethanol, N-methylformamide, N,N-dimethylformamide, N-methylformanilide, N-methylacetamide, N,N-dimethylacetamide, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, phenyl cellosolve acetate, or the like.

The materials listed and described above as examples of materials that may be used for the solvent component of the photoresist are merely illustrative and are not intended to limit the embodiments. Rather, any suitable materials that dissolve the polymer resin and the PACs may be used to help mix and apply the photoresist. All such materials are fully intended to be included within the scope of the embodiments.

Additionally, while individual ones of the above described materials may be used as the solvent for the photoresist and floating additive polymer, in other embodiments more than one of the above described materials are used. For example, in some embodiments, the solvent includes a combination mixture of two or more of the materials described. All such combinations are fully intended to be included within the scope of the embodiments.

In addition to the polymer resins, the PACs, the solvents, the cross-linking agent, and the coupling reagent, some embodiments of the photoresist 12 also include a number of other additives that assist the photoresist to obtain high resolution. For example, some embodiments of the photoresist 12 also includes surfactants in order to help improve the ability of the photoresist to coat the surface on which it is applied. In some embodiments, the surfactants include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, and polyoxyethylene sorbitan fatty acid esters.

Specific examples of materials used as surfactants in some embodiments include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether, polyoxyethylene cetyl ether, fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations thereof, or the like.

Another additive added to some embodiments of the photoresist 12 is a quencher, which inhibits diffusion of the generated acids/bases/free radicals within the photoresist. The quencher improves the resist pattern configuration as well as the stability of the photoresist over time. In an embodiment, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof such as its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phenylphosphinic acid.

Another additive added to some embodiments of the photoresist 12 is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also be used for the stabilizer in some embodiments, including ammonium, primary, secondary, tertiary, and quaternary alkyl- and aryl-ammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist 12 is a dissolution inhibitor to help control dissolution of the photoresist during development. In an embodiment bile-salt esters may be utilized as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

Another additive in some embodiments of the photoresist 12 is a plasticizer. Plasticizers may be used to reduce delamination and cracking between the photoresist and underlying layers (e.g., the layer to be patterned). Plasticizers include monomeric, oligomeric, and polymeric plasticizers, such as oligo- and polyethyleneglycol ethers, cycloaliphatic esters, and non-acid reactive steroidaly-derived materials. Specific examples of materials used for the plasticizer in some embodiments include dioctyl phthalate, didodecyl phthalate, triethylene glycol dicaprylate, dimethyl glycol phthalate, tricresyl phosphate, dioctyl adipate, dibutyl sebacate, triacetyl glycerine, or the like.

A coloring agent is another additive included in some embodiments of the photoresist 12. The coloring agent observers examine the photoresist and find any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), rhodamine 6G (C. I. 45160), benzophenone compounds, such as 2,4-dihydroxybenzophenone and 2,2', 4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and 2'-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1-benzopyran-2-one; thioxanthone compounds, such as diethylthioxanthone; stilbene compounds, naphthalic acid compounds, azo dyes, phthalocyanine blue, phthalocyanine green, iodine green, Victoria blue, crystal violet, titanium oxide, naphthalene black, Photopia methyl violet, bromphenol blue and bromcresol green; laser dyes, such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives are added to some embodiments of the photoresist 12 to promote adhesion between the photoresist and an underlying layer upon which the photoresist has been applied (e.g., the layer to be patterned). In some embodiments, the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxypteridine and derivatives, 1,10-phenanthroline and derivatives, 2,2'-bipyridine and derivatives, benzotriazoles, organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations thereof, or the like.

Surface leveling agents are added to some embodiments of the photoresist 12 to assist a top surface of the photoresist to be level, so that impinging light will not be adversely modified by an unlevel surface. In some embodiments, surface leveling agents include fluoroaliphatic esters, hydroxyl terminated fluorinated polyethers, fluorinated ethylene glycol polymers, silicones, acrylic polymer leveling agents, combinations thereof, or the like.

Some embodiments of the photoresist 12 include metal oxide nanoparticles. In some embodiments, the photoresist includes one or more metal oxides nanoparticles selected from the group consisting of titanium dioxide, zinc oxide, zirconium dioxide, nickel oxide, cobalt oxide, manganese oxide, copper oxides, iron oxides, strontium titanate, tungsten oxides, vanadium oxides, chromium oxides, tin oxides, hafnium oxide, indium oxide, cadmium oxide, molybdenum oxide, tantalum oxides, niobium oxide, aluminum oxide, and combinations thereof. As used herein, nanoparticles are particles having an average particle size between 1 and 10 nm. In some embodiments the metal oxide nanoparticles have an average particle size between 2 and 5 nm. In some embodiments, the amount of metal oxide nanoparticles in the photoresist composition ranges from about 1 wt. % to about 10 wt. % based on the total weight of the photoresist composition. In some embodiments, metal oxide nanoparticle concentrations below 1 wt. % provide photoresist layers that are too thin, and metal oxide nanoparticle concentrations greater than about 10 wt. % provide a photoresist composition that is too viscous and that will be difficult to provide a photoresist coating of uniform thickness on the substrate.

In some embodiments, the metal oxide nanoparticles are complexed with carboxylic acid or sulfonic acid ligands. For example, in some embodiments, zirconium oxide or hafnium oxide nanoparticles are complexed with methacrylic acid forming hafnium methacrylic acid (HfMAA) or zirconium methacrylic acid (ZrMAA). In some embodiments, the HfMAA or ZrMAA are dissolved at about a 5 wt. % to about 10 wt. % weight range in a coating solvent, such as propylene glycol methyl ether acetate (PGMEA). In some embodiments, about 1 wt. % to about 10 wt. % of a photoactive compound (PAC) based on the total weight of the photoresist composition to form a metal oxide resist. In some embodiments, the floating additive polymer is added to the metal oxide resist.

In some embodiments, the polymer resins (photoresist layer and upper layer) and the PACs, along with any desired additives or other agents, are added to the solvent for application. Once added, the mixture is then mixed in order to achieve a homogenous composition throughout the photoresist to ensure that there are no defects caused by uneven mixing or nonhomogenous composition of the photoresist. Once mixed together, the photoresist may either be stored prior to its usage or used immediately.

In some embodiments, the floating additive polymer composition is prepared separate from the photoresist composition, and applied separately to the photoresist-coated substrate, as shown in FIGS. 3A-3D. In such embodiments, the floating additive polymer 18 is a siloxane polymer as described herein. In an embodiment, the floating additive polymer 18 has a weight average molecular weight of about 1000 to about 20,000.

The floating additive polymer 18 is placed into a solvent in order to aid in dispensing of the floating additive polymer. To aid in the mixing and dispensing of the floating additive polymer, the solvent is chosen at least in part based upon the materials chosen for the polymer resins as well as the PACs.

In some embodiments, the solvent is an organic solvent, and includes one or more of any suitable solvents disclosed herein as solvents of the photoresist 12. In some embodiments, the solvent for the floating additive polymer 18 is the same as or different from the solvent for the photoresist 12.

The materials listed and described above as examples of materials that may be used for the solvent of the floating additive polymer are merely illustrative and are not intended to limit the embodiments. Rather, any suitable materials that dissolve the floating additive polymer resin to help mix and apply the floating additive polymer. All such materials are fully intended to be included within the scope of the embodiments.

Once ready, the photoresist/floating additive polymer composition 12, 18 is applied onto the layer to be patterned, as shown in FIG. 2A, such as the substrate 10 to form a photoresist layer 15 and an upper layer 20, as shown in FIG. 2B. In some embodiments, the photoresist/floating additive polymer composition is applied using a process such as a spin-on coating process. In other embodiments, a dip coating method, an air-knife coating method, a curtain coating method, a wire-bar coating method, a gravure coating method, a lamination method, an extrusion coating method, combinations of these, or the like are used to coat the photoresist on the substrate. In some embodiments, the photoresist layer 15 thickness ranges from about 10 nm to about 300 nm, and the upper layer thickness ranges from about 0.1 nm to about 20 nm. In some embodiments, the thickness of the upper layer ranges from about 1 nm to about 15 nm.

After the photoresist layer 15 and upper layer 20 have been applied to the substrate 10, a pre-bake of the photoresist layer is performed in some embodiments to dry the photoresist prior to radiation exposure. The drying of the photoresist layer 15 and upper layer 20 removes the solvent component while leaving behind the polymer resins, the PACs, the cross-linking agent, and the other chosen additives. In some embodiments, the pre-baking is performed at a temperature suitable to evaporate the solvent, such as between about 40° C. and 120° C., although the precise temperature depends upon the materials chosen for the photoresist. The pre-baking is performed for a time sufficient to dry the photoresist layer and upper layer, such as between about 10 seconds to about 10 minutes.

In some embodiments, the photoresist layer 15 and upper layer 20 are separately formed, as shown in FIGS. 3A-3D. In some embodiments, each of the photoresist and floating additive polymer are applied using a process such as a spin-on coating process, a dip coating method, an air-knife coating method, a curtain coating method, a wire-bar coating method, a gravure coating method, a lamination method, an extrusion coating method, combinations of these, or the like. Each of the photoresist layer 15 and upper layer 20 are pre-baked after application to cure and dry. In some embodiments, each pre-baking operation is performed at a temperature suitable to evaporate the respective solvents, such as between about 40° C. and 120° C., for a period of time between about 10 seconds to about 10 minutes.

FIGS. 4A and 4B illustrate selective exposures of the photoresist layer to form an exposed region 50 and an unexposed region 52. In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, the radiation source (not shown) supplies radiation 45/97, such as ultraviolet light, to the photoresist layer 15 in order to induce a reaction of the PACs, which in turn reacts with the polymer resin to chemically alter those regions of the photoresist layer to which the radiation 45/97 impinges. In some embodiments the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In an embodiment, the patterned radiation 45/97 is extreme ultraviolet light having a 13.5 nm wavelength, the PAC is a photoacid generator, the group to be decomposed is a carboxylic acid group on the hydrocarbon structure, and a cross linking agent is used. The patterned radiation 45/97 impinges upon the photoacid generator, the photoacid generator absorbs the impinging patterned radiation 45/97. This absorption initiates the photoacid generator to generate a proton (e.g., a $H^+$ atom) within the photoresist layer 15. When the proton impacts the carboxylic acid group on the hydrocarbon structure, the proton reacts with the carboxylic acid group, chemically altering the carboxylic acid group and altering the properties of the polymer resin in general. The carboxylic acid group then reacts with the cross-linking agent in some embodiments to cross-link with other polymer resins within the exposed region of the photoresist layer 15.

In some embodiments, the exposure of the photoresist layer 15 uses an immersion lithography technique. In such a technique, an immersion medium (not shown) is placed between the final optics and the photoresist layer, and the exposure radiation 45 passes through the immersion medium.

In some embodiments, the thickness of the upper layer 20 is sufficiently thin so that the upper layer 20 does not adversely affect the exposure of the photoresist layer 15 to the radiation 45/97.

After the photoresist layer 15 has been exposed to the exposure radiation 45/97 a post-exposure baking is performed in some embodiments to assist in the generating, dispersing, and reacting of the acid/base/free radical generated from the impingement of the radiation 45/97 upon the PACs during the exposure. Such thermal assistance helps to create or enhance chemical reactions which generate chemical differences between the exposed region 50 and the unexposed region 52 within the photoresist layer 15. These chemical differences also cause differences in the solubility between the exposed region 50 and the unexposed region 52. In some embodiments, the post-exposure baking occurs at temperatures ranging from about 50° C. to about 160° C. for a period of between about 20 seconds and about 120 seconds.

After the selective radiation exposure and/or the post-exposure bake operation, the PAC in the photoresist produces an acid in some embodiments, and thus increases or decreases its solubility. The solubility may be increased for a positive tone resist (i.e., the acid will cleave an acid cleavable polymer, resulting in the polymer becoming more hydrophilic) and decreased for negative tone resist (i.e., the acid will catalyze an acid catalyzed crosslinkable polymer or cause a polymeric pinacol to undergo pinacol rearrangement, resulting in the polymer becoming more hydrophobic). Thus, when an aqueous-based developer is used, the developer will dissolve the exposed portions of the positive resist but not the exposed portions of the negative tone resist.

The inclusion of a cross-linking agent into the chemical reactions helps the components of the polymer resin (e.g., the individual polymers) react and bond with each other, increasing the molecular weight of the bonded polymer in some embodiments. In particular, an initial polymer has a side chain with a carboxylic acid protected by one of the groups to be removed/acid labile groups. The groups to be removed are removed in a de-protecting reaction, which is initiated by a proton $H^+$ generated by, e.g., the photoacid generator during either the exposure process or during the post-exposure baking process. The $H^+$ first removes the groups to be removed/acid labile groups and another hydrogen atom may replace the removed structure to form a de-protected polymer. Once de-protected, a cross-linking reaction occurs between two separate de-protected polymers that have undergone the de-protecting reaction and the cross-linking agent in a cross-linking reaction. In particular, hydrogen atoms within the carboxylic groups formed by the de-protecting reaction are removed and the oxygen atoms react with and bond with the cross-linking agent. This bonding of the cross-linking agent to two polymers bonds the two polymers not only to the cross-linking agent but also bonds the two polymers to each other through the cross-linking agent, thereby forming a cross-linked polymer.

By increasing the molecular weight of the polymers through the cross-linking reaction, the new cross-linked polymer becomes less soluble in organic solvent negative tone resist developers.

Development is performed using a solvent. In some embodiments where positive tone development is desired, a positive tone developer such as a basic aqueous solution is used to remove regions 50 of the photoresist exposed to radiation. In some embodiments, the positive tone developer 57 includes one or more selected from tetramethylammonium hydroxide (TMAH), tetrabutylammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide, combinations of these, or the like.

In some embodiments where negative tone development is desired, an organic solvent or critical fluid is used to remove the unexposed regions 52 of the photoresist. In some embodiments, the negative tone developer 57 includes one or more selected from hexane, heptane, octane, toluene, xylene, dichloromethane, chloroform, carbon tetrachloride, trichloroethylene, and like hydrocarbon solvents; critical carbon dioxide, methanol, ethanol, propanol, butanol, and like alcohol solvents; diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether and like ether solvents; acetone, methyl ethyl ketone, methyl isobutyl ketone, isophorone, cyclohexanone and like ketone solvents; methyl acetate, ethyl acetate, propyl acetate, butyl acetate and like ester solvents; pyridine, formamide, and N,N-dimethyl formamide or the like.

In some embodiments, the developer 57 is applied to the upper layer 20 and photoresist layer 15 using a spin-on process. In the spin-on process, the developer 57 is applied to the upper layer 20 and photoresist layer 15 by a dispenser 62 from above while the coated substrate is rotated, as shown in FIG. 5. The developer 57 is selected so that it both removes the upper layer 20 and the appropriate region of photoresist layer 15. In the case of a positive resist, the exposed region 50 of the photoresist layer is removed, and in the case of a negative resist the unexposed regions 52 of the photoresist layer are removed. In some embodiments, the developer 57 is supplied at a rate of between about 5 ml/min and about 800 ml/min, while the coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer 57 dissolves the upper layer 20 and radiation unexposed regions 52 of the cross-linked negative resist, exposing the surface of the substrate 10, as shown in FIG. 6, and leaving behind well-defined exposed photoresist regions 50, in some embodiments.

Figure 7:
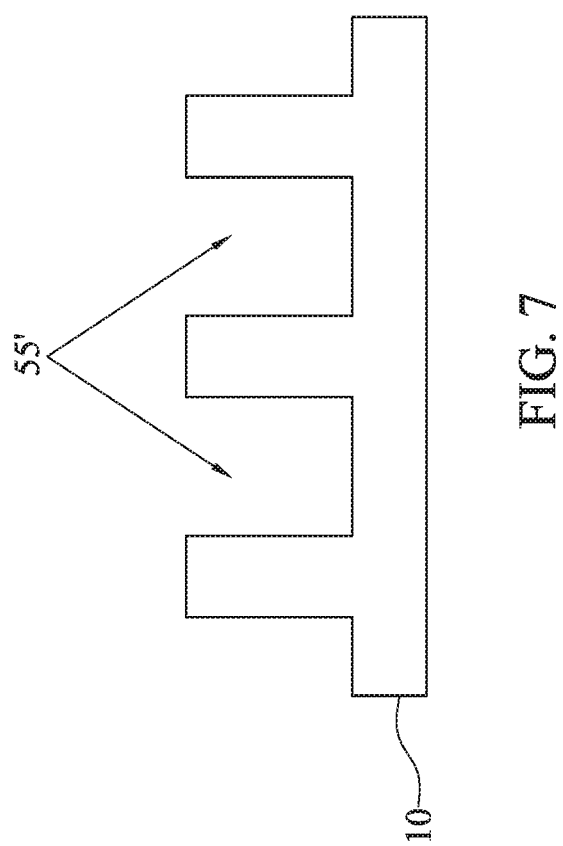
FIG. 7 shows a process stage of a sequential operation according to an embodiment of the disclosure.
Figure 8:
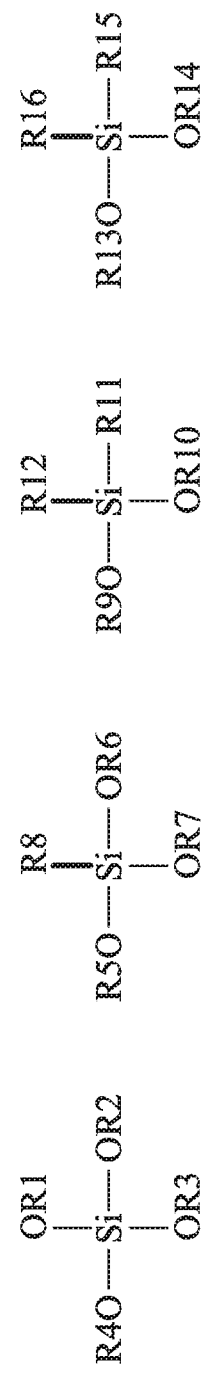
FIG. 8 shows floating additive polymer components according to embodiments of the disclosure.

After the developing operation S150, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer 50 is in place. For example, an etching operation, using dry or wet etching, is performed in some embodiments, to transfer the pattern 55 of the photoresist layer 50 to the underlying substrate 10, forming recesses 55' as shown in FIG. 7. The substrate 10 has a different etch resistance than the photoresist layer 15. In some embodiments, the etchant is more selective to the substrate 10 than the photoresist layer 15.

In some embodiments, the substrate 10 and the photoresist layer 15 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

Figure 9:
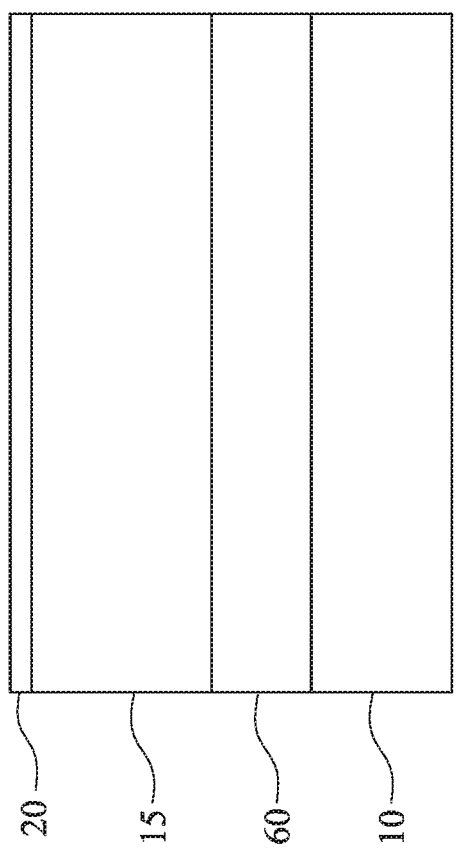
FIG. 9 shows a process stage of a sequential operation according to an embodiment of the disclosure.

In some embodiments, a layer to be patterned 60 is disposed over the substrate prior to forming the photoresist layer 15, as shown in FIG. 9. In some embodiments, the layer to be patterned 60 is a hard mask layer; metallization layer; or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 10A:
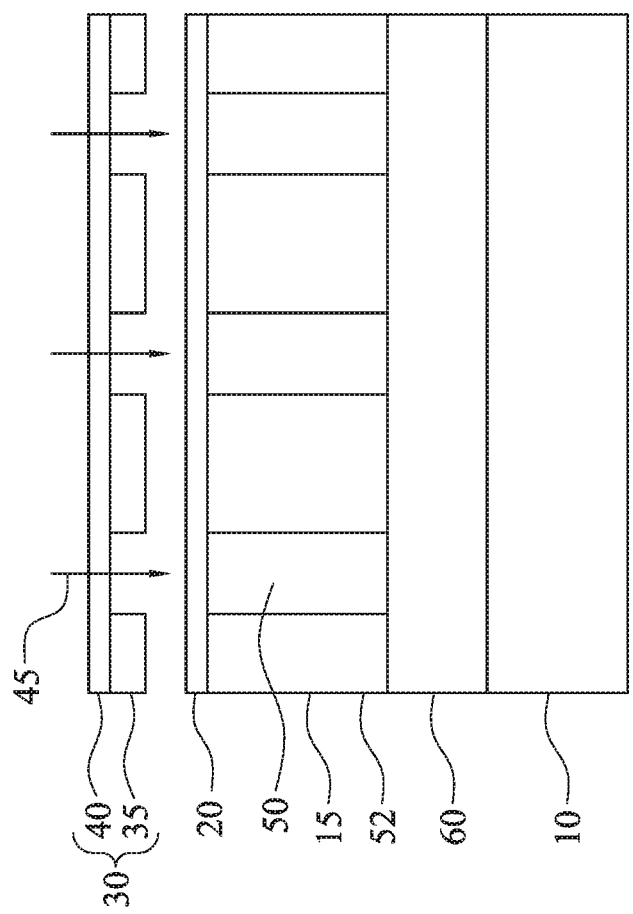
FIGS. 10A and 10B show process stages of a sequential operation according to an embodiment of the disclosure.
Figure 10B:
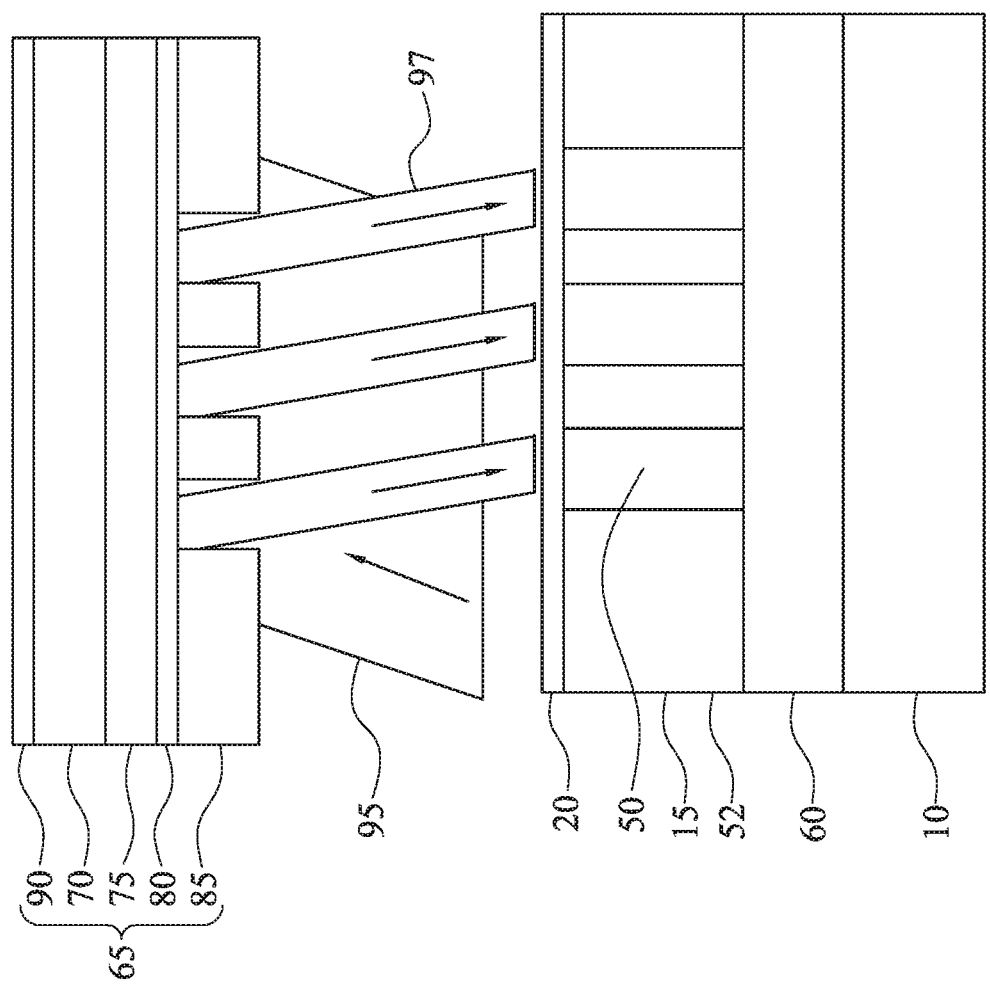

The photoresist layer 15 is subsequently selectively exposed to actinic radiation 45/97 to form exposed regions 50 and unexposed regions 52 in the photoresist layer, as shown in FIGS. 10A and 10B, and described herein in relation to FIGS. 4A and 4B. In these embodiments, the photoresist is a positive tone photoresist, wherein the solubility of the photoresist polymer in the developer 57 increases in the exposed regions 50.

Figure 11:
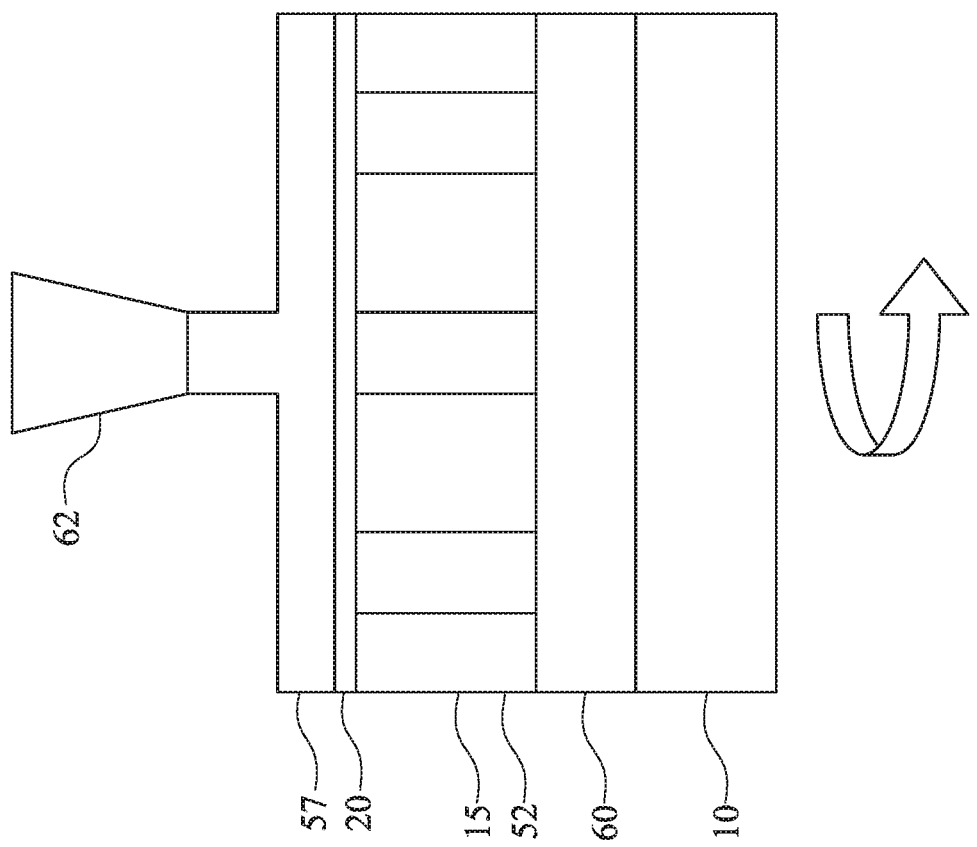
FIG. 11 shows a process stage of a sequential operation according to an embodiment of the disclosure.
Figure 12:
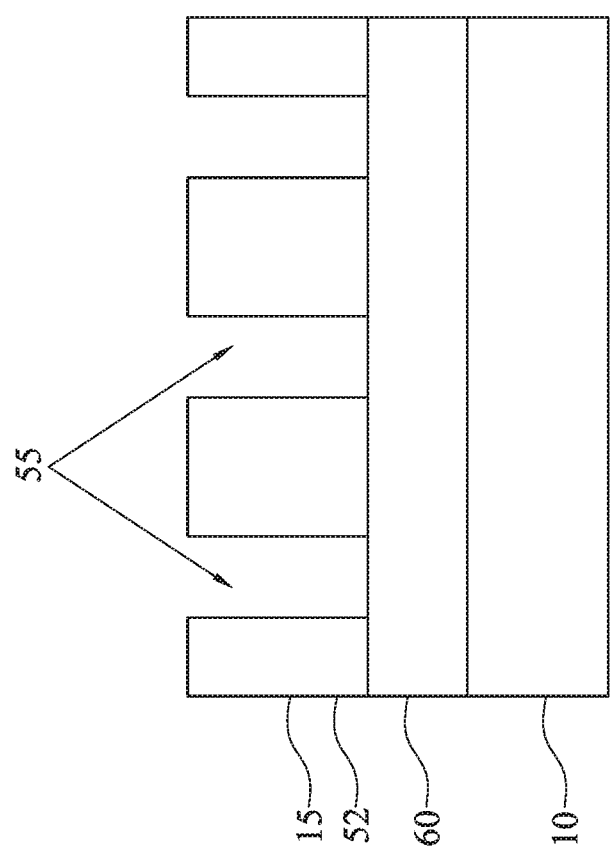
FIG. 12 shows a process stage of a sequential operation according to an embodiment of the disclosure.

As shown in FIG. 11, the exposed photoresist regions 50 are developed by dispensing developer 57 from a dispenser 62 to form a pattern of photoresist openings 55, as shown in FIG. 12. The upper layer 20 and the exposed photoresist regions are removed by the developer 57 in this embodiment.

Figure 13:
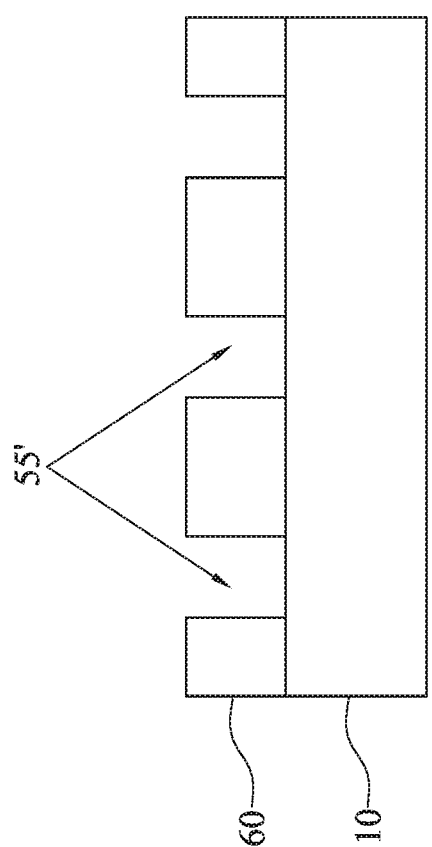
FIG. 13 shows a process stage of a sequential operation according to an embodiment of the disclosure.

Then as shown in FIG. 13, the pattern 55 in the photoresist layer 15 is transferred to the layer to be patterned 60 using an etching operation and the photoresist layer is removed, as explained with reference to FIG. 7 to form pattern 55' in the layer to be patterned 60.

The novel upper layer and photolithography techniques according to the present disclosure provide improved critical dimension variation and reduces defects. The upper layer includes a low etch rate floating additive polymer that improves resist de-scum without adversely affecting the etch budget. The floating additive polymer composition and methods provides a thinner resist having good-etch selectivity for de-scum purposes. In addition, the composition and methods of the present disclosure provides a more cost effective lithography process that can eliminate hard mask formation and patterning operations.

An embodiment of the disclosure is a method of forming a photoresist pattern, including forming an upper layer including a siloxane polymer over a photoresist layer formed on a substrate. The photoresist layer is selectively exposed to actinic radiation. The photoresist layer is developed to form a pattern in the photoresist layer, and the upper layer is removed. In an embodiment, the siloxane polymer includes one or more monomers selected from:

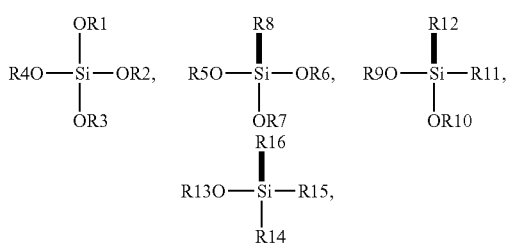

where R8, R11, R12, R15, and R16 are same or different, and are any C2 to C20 organic group or any fluorine substituted C2 to C20 organic group; and where R1, R2, R3, R4, R5, R6, R7, R9, R10, R13, and R14 are same or different, and are H, a C1 to C6 alkyl group, or a fluorine substituted C1 to C6 alkyl group. In an embodiment, the method includes heating the photoresist layer before forming the upper layer. In an embodiment, the photoresist layer includes metal oxide nanoparticles. In an embodiment, the actinic radiation is extreme ultraviolet radiation. In an embodiment, the method includes heating the photoresist layer and upper layer after selectively exposing the photoresist layer. In an embodiment, the upper layer has a thickness ranging from 0.1 nm to 20 nm. In an embodiment, a combined thickness of the photoresist layer and the upper layer ranges from 10 nm to 320 nm. In an embodiment, the upper layer contains at least 5 wt. % of the siloxane polymer based on the total weight of the upper layer. In an embodiment, a weight average molecular weight of the siloxane polymer ranges from 1000 to 20,000. In an embodiment, the concentration of Si in the siloxane polymer ranges from 15 wt. % to 42 wt. % based on the weight of the siloxane polymer. In an embodiment, the method includes performing a de-scum operation after developing the photoresist layer. In an embodiment, the photoresist pattern is formed without forming an additional silicon-containing layer under the photoresist layer. In an embodiment, the photoresist pattern is formed without forming a hard mask layer under the photoresist layer.

Another embodiment of the disclosure is a method of forming a photoresist pattern, including disposing a mixture of a floating additive polymer and a photoresist over a substrate. The substrate is rotated with the mixture disposed thereon, wherein the floating additive polymer separates from the photoresist, rising to an upper portion of the mixture forming an upper layer comprising the floating additive polymer disposed over a photoresist layer. The photoresist layer is selectively exposed to actinic radiation. The photoresist layer is developed to form a pattern in the photoresist layer, and the upper layer is removed. The floating additive polymer is a siloxane polymer. In an embodiment, the siloxane polymer comprises one or more monomers selected from:

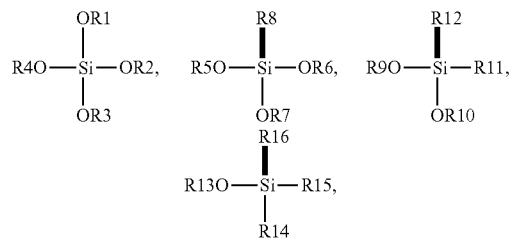

where R8, R11, R12, R15, and R16 are same or different, and are any C2 to C20 organic group or any fluorine substituted C2 to C20 organic group; and where R1, R2, R3, R4, R5, R6, R7, R9, R10, R13, and R14 are same or different, and are H, a C1 to C6 alkyl group, or a fluorine substitute C1 to C6 alkyl group. In an embodiment, the photoresist layer includes metal oxide nanoparticles. In an embodiment, the method includes heating the photoresist layer and upper layer after selectively exposing the photoresist layer. In an embodiment, the upper layer contains a higher concentration of the floating additive polymer than the photoresist layer. In an embodiment, the upper layer contains at least 5 wt. % of the floating additive polymer based on the total weight of the upper layer. In an embodiment, the method includes performing a de-scum operation after developing the photoresist layer. In an embodiment, the photoresist pattern is formed without forming an additional silicon-containing layer under the photoresist layer. In an embodiment, the photoresist pattern is formed without forming a hard mask layer under the photoresist layer. In an embodiment, the actinic radiation is extreme ultraviolet radiation. In an embodiment, the upper layer has a thickness ranging from 0.1 nm to 20 nm. In an embodiment, a combined thickness of the photoresist layer and the upper layer ranges from 10 nm to 320 nm. In an embodiment, a weight average molecular weight of the siloxane polymer ranges from 1000 to 20,000. In an embodiment, the concentration of Si in the siloxane polymer ranges from 15 wt. % to 42 wt. % based on the weight of the siloxane polymer.

Another embodiment of the disclosure is a photoresist composition, including a photoresist material, and a siloxane polymer including one or more monomers selected from:

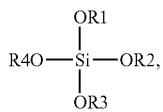

where R8, R11, R12, R15, and R16 are same or different, and are any C2 to C20 organic group or any fluorine substituted C2 to C20 organic group; and R1, R2, R3, R4, R5, R6, R7, R9, R10, R13, and R14 are same or different, and are H, a C1 to C6 alkyl group, or a fluorine substituted C1 to C6 alkyl group. In an embodiment, the photoresist material comprises metal oxide nanoparticles. In an embodiment, a weight average molecular weight of the floating additive polymer ranges from 1000 to 20,000. In an embodiment, the concentration of Si in the floating additive polymer ranges from 15 wt. % to 42 wt. % based on the weight of the floating additive polymer.

Another embodiment of the disclosure is a method of forming a photoresist pattern, including forming an upper layer including a siloxane polymer over a photoresist layer formed on a substrate. The siloxane polymer includes one or more monomers selected from:

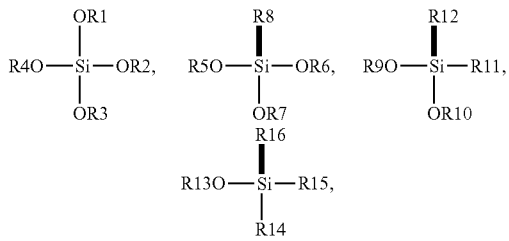

where R8, R11, R12, R15, and R16 are same or different, and are any C2 to C20 organic group or any fluorine substituted C2 to C20 organic group; and where R1, R2, R3, R4, R5, R6, R7, R9, R10, R13, and R14 are same or different, and are H, a C1 to C6 alkyl group, or a fluorine substitute C1 to C6 alkyl group. The photoresist layer is selectively exposed to actinic radiation. The photoresist layer is developed to form a pattern in the photoresist layer; and a de-scum operation is performed after forming the pattern. In an embodiment, the photoresist layer includes metal oxide nanoparticles. In an embodiment, the method includes heating the photoresist layer and upper layer after selectively exposing the photoresist layer. In an embodiment, the upper layer contains at least 5 wt. % of the siloxane polymer based on the total weight of the upper layer. In an embodiment, the concentration of Si in the siloxane polymer ranges from 15 wt. % to 42 wt. % based on the weight of the siloxane polymer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a photoresist pattern, comprising:
    forming a single photoresist layer over a substrate without forming a silicon-containing layer between the single photoresist layer and the substrate;
    forming an upper layer including a siloxane polymer over the single photoresist layer;
    heating the single photoresist layer before forming the upper layer;
    selectively exposing the upper layer and the single photoresist layer to actinic radiation;
    developing the single photoresist layer to form a pattern in the single photoresist layer; and
    removing the upper layer,
    wherein the single photoresist layer contains another polymer and one or more photoactive compounds, and the another polymer has a hydrocarbon structure as a skeletal backbone, and
    wherein the siloxane polymer consists of monomers represented by

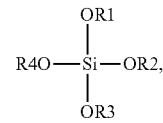

where R1, R2, R3, and R4 are same or different, and are a C1 to C6 alkyl group, or a fluorine substituted C1 to C6 alkyl group.

2. The method according to claim 1, wherein the single photoresist layer includes metal oxide nanoparticles.

3. The method according to claim 1, further comprising heating the single photoresist layer and upper layer after selectively exposing the single photoresist layer.

4. The method according to claim 1, wherein the upper layer contains at least 5 wt. % of the siloxane polymer based on the total weight of the upper layer.

5. The method according to claim 1, wherein the concentration of Si in the siloxane polymer ranges from 15 wt. % to 42 wt. % based on the weight of the siloxane polymer.

6. The method according to claim 1, further comprising performing a de-scum operation after developing the single photoresist layer.

7. The method according to claim 1, wherein R1, R2, R3, and R4 are same or different, and are a C1 to C6 alkyl group, or a fluorine substituted C1 to C6alkyl group.

8. The method according to claim 1, wherein R1, R2, R3, and R4 are same.

9. A method of forming a photoresist pattern, comprising:
disposing a mixture of a floating additive polymer and a photoresist over a substrate;
rotating the substrate with the mixture disposed thereon, wherein the floating additive polymer separates from the photoresist rising to an upper portion of the mixture forming an upper layer comprising the floating additive polymer disposed over a single photoresist layer, without forming a silicon-containing layer between the single photoresist layer and the substrate;
selectively exposing the upper layer and the single photoresist layer to actinic radiation;
developing the single photoresist layer to form a pattern in the single photoresist layer; and
removing the upper layer,
wherein the floating additive polymer is a siloxane polymer,
wherein the photoresist contains another polymer and one or more photoactive compounds, and the another polymer has a hydrocarbon structure as a skeletal backbone, and
wherein the siloxane polymer consists of monomers represented by

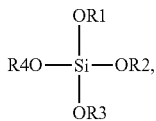

where R1, R2, R3, and R4 are same or different, and are a C1 to C6 alkyl group, or a fluorine substituted C1 to C6 alkyl group.

10. The method according to claim 9, wherein the single photoresist layer includes metal oxide nanoparticles.

11. The method according to claim 9, further comprising heating the single photoresist layer and upper layer after selectively exposing the single photoresist layer.

12. The method according to claim 9, wherein the upper layer contains at least 5 wt. % of the floating additive polymer based on the total weight of the upper layer.

13. The method according to claim 9, further comprising performing a de-scum operation after developing the single photoresist layer.

14. The method according to claim 9, wherein the photoresist pattern is formed without forming an additional silicon-containing layer under the single photoresist layer.

15. The method according to claim 9, wherein the photoresist pattern is formed without forming a hard mask layer under the single photoresist layer.

16. The method according to claim 9, wherein the upper layer has a thickness ranging from 0.1 nm to 20 nm.

17. The method according to claim 9, wherein R1, R2, R3, and R4 are same.

18. A photoresist composition, comprising:
a photoresist material; and
a siloxane polymer consisting of monomers represented by

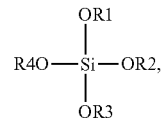

where R1, R2, R3, and R4 are same or different, and are a C1 to C6 alkyl group, or a fluorine substituted C1 to C6 alkyl group, and
wherein the photoresist material contains another polymer and one or more photoactive compounds, and the another polymer has a hydrocarbon structure as a skeletal backbone.

19. The photoresist composition of claim 18, wherein the photoresist material comprises metal oxide nanoparticles.

20. The photoresist composition of claim 18, wherein R1, R2, R3, and R4 are same.

* * * * *